(12) United States Patent
Deckers et al.

(10) Patent No.: US 9,025,148 B2
(45) Date of Patent: May 5, 2015

(54) ALIGNMENT MARK, SUBSTRATE, SET OF PATTERNING DEVICES, AND DEVICE MANUFACTURING METHOD

(75) Inventors: David Deckers, Schilde (BE); Sam Musa, Veldhoven (NL)

(73) Assignee: ASML Netherlands B.V., Veldhoven (NL)

(*) Notice: Subject to any disclaimer, the term of this patent is extended or adjusted under 35 U.S.C. 154(b) by 428 days.

(21) Appl. No.: 13/043,861

(22) Filed: Mar. 9, 2011

(65) Prior Publication Data

US 2012/0057159 A1 Mar. 8, 2012

Related U.S. Application Data

(60) Provisional application No. 61/314,834, filed on Mar. 17, 2010.

(51) Int. Cl.
*G01B 11/00* (2006.01)
*G03F 1/42* (2012.01)
*G03F 7/20* (2006.01)

(52) U.S. Cl.
CPC .............. *G03F 1/42* (2013.01); *G03F 7/70633* (2013.01); *G03F 7/70683* (2013.01)

(58) Field of Classification Search
CPC .... G03F 1/42; G03F 7/70683; G03F 7/70633
USPC ........... 356/399–401; 250/548; 355/53, 5, 77; 430/5, 22, 30; 438/401; 257/797; 382/151
See application file for complete search history.

(56) References Cited

U.S. PATENT DOCUMENTS 5,733,690 A * 3/1998 Jeong et al. ................... 430/5
6,936,931 B2 8/2005 Baek et al.
7,190,455 B2 * 3/2007 Matsumoto ................... 356/401
7,258,953 B2 * 8/2007 Do et al. ........................... 430/5

FOREIGN PATENT DOCUMENTS

JP 2002-100557 A 4/2002
JP 2002-329662 A 11/2002
JP 2003-224049 A 8/2003

OTHER PUBLICATIONS

English-Language Abstract for Japanese Patent Publication No. 2002-100557 A, published Apr. 5, 2002; 1 page.
English-Language Abstract for Japenese Patent Publicatiob No. 2003-224049 A, published Aug. 8, 2003; 1 page.

* cited by examiner

*Primary Examiner* — Kara E Geisel
*Assistant Examiner* — Rufus Phillips
(74) *Attorney, Agent, or Firm* — Sterne, Kessler, Goldstein & Fox P.L.L.C.

(57) ABSTRACT

An alignment mark determines alignment of a first and a second exposure on a substrate on a macro level and a micro level. The alignment mark includes a first alignment pattern projected during the first exposure and a second alignment pattern projected during the second exposure. The alignment mark includes a first sub-mark at least partially defined by the first alignment pattern and a second sub-mark at least partially defined by the second alignment pattern. Relative positions of the first and second sub-marks on the substrate are representative for alignment of the first and second exposures on the macro level. At least one sub-mark is defined by image lines of the first alignment pattern and the second alignment pattern, and wherein relative positions of image lines of the first alignment pattern and image lines of the second alignment pattern of the at least one sub-mark are representative for alignment of the first and second exposures on the micro level.

11 Claims, 5 Drawing Sheets

ALIGNMENT MARK, SUBSTRATE, SET OF PATTERNING DEVICES, AND DEVICE MANUFACTURING METHOD

CROSS REFERENCE TO RELATED APPLICATIONS

This application claims benefit under 35 U.S.C. 119(e) to U.S. Provisional Application No. U.S. 61/314,834, filed Mar. 17, 2010, which is incorporated by reference herein in its entirety.

BACKGROUND

1. Field of the Invention

The invention relates to an alignment mark, a substrate, a set of patterning devices, and a method for manufacturing a device.

2. Related Art

A lithographic apparatus is a machine that applies a desired pattern onto a substrate, usually onto a target portion of the substrate. A lithographic apparatus can be used, for example, in the manufacture of integrated circuits (ICs). When so used, a patterning device, which is alternatively referred to as a mask or a reticle, may be used to generate a circuit pattern to be formed on an individual layer of the IC. This pattern can be transferred onto a target portion (e.g. including part of, one, or several dies) of a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In practice, multiple patterns may be projected on top of each other to obtain a three dimensional product structure. It is important that multiple patterns are properly aligned with respect to each other. This overlay requirement is increasingly important with increasing resolution.

In lithography processes, double patterning methods such as Litho Etch, Litho Freeze, etc., may be used. Such techniques are used to enhance feature density on the substrate.

With the use of these techniques alignment of the first and second exposure on product resolution level has become even more important. Therefore, there is a need for a system and a method to determine alignment of a first and second exposure on both a macro level, as for instance used in conventional alignment measurement tools, and a micro level, for instance at product resolution level.

Several methods and measurement tools are available to measure overlay of multiple exposures. However, different methods and tools are suitable for different measurement ranges, and the measurement techniques of the different methods and tools cannot be (directly) compared.

SUMMARY

This section of this patent document is for the purpose of summarizing some aspects of the invention and to briefly introduce some preferred embodiments. Simplifications or omissions are made to avoid obscuring the purpose of the section. Such simplifications or omissions are not intended to limit the scope of the present invention. Consistent with the principles of the invention as embodied and broadly described herein, the invention is summarized as follows.

It is desirable to provide an alignment mark which can be used to determine alignment of multiple exposures at two magnitude levels (e.g. at macro level and at micro level) at a single location.

According to an embodiment of the invention, there is provided an alignment mark which is configured and arranged to determine alignment of a first and a further exposure on a substrate on a macro level and/or a micro level, the alignment mark including a first alignment pattern projected during the first exposure and a second alignment pattern projected during the further exposure. The alignment mark includes a first sub-mark at least partially defined by the first alignment pattern and a second sub-mark at least partially defined by the second alignment pattern. Relative positions of the first and second sub-marks on the substrate are representative for alignment of the first and further exposures on the macro level. At least one sub-mark at least partially is defined by image lines of the first alignment pattern and the second alignment pattern. Part of the image lines is projected during the first exposure and a part of the image lines is projected during the further exposure. Relative positions of image lines of the first alignment pattern and image lines of the second alignment pattern of the at least one sub-mark are representative for alignment of the first and second exposures on the micro level.

According to an embodiment of the invention, there is provided a substrate comprising an alignment mark to determine alignment of a first and a further exposure on a substrate on a macro level and/or a micro level. The alignment mark includes a first alignment pattern projected during the first exposure and a second alignment pattern projected during the further exposure. The alignment mark includes a first sub-mark at least partially defined by the first alignment pattern and a second sub-mark at least partially defined by the second alignment pattern. Relative positions of the first and second sub-marks on the substrate are representative for alignment of the first and further exposures on the macro level. At least one sub-mark at partially is defined by image lines of the first alignment pattern and the second alignment pattern. A part of the image lines is projected during the first exposure and a part of the image lines is projected during the further exposure. Relative positions of image lines of the first alignment pattern and image lines of the second alignment pattern of the at least one sub-mark are representative for alignment of the first and second exposures on the micro level.

According to an embodiment of the invention, there is provided a set of patterning devices for use in a lithographic process. A first patterning device having a first alignment pattern to be projected on a substrate during a first exposure as part of an alignment mark, and a second patterning device having a second alignment pattern to be projected on the substrate during a further exposure as part of the same alignment mark. The first alignment pattern at least partially defines a first sub-mark of the alignment mark, and wherein the second alignment pattern at least partially defines a second sub-mark of the alignment mark. Relative positions of the first and second sub-marks on the substrate are suitable to determine alignment of the first and further exposures on a macro level. The first alignment pattern and the second alignment pattern in combination define at least one sub-mark which is at least partially defined by image lines of the first alignment pattern and the second alignment pattern, wherein a part of the image lines is projected during the first exposure and a part of the image lines is projected during the further exposure. Relative positions of image lines of the first alignment pattern and the second alignment pattern of the at least one sub-mark on the substrate are suitable to determine alignment of the first and further exposures on a micro level.

According to an embodiment of the invention, there is provided a device manufacturing method including:

transferring during a first exposure a pattern from a first patterning device onto a substrate, transferring during a further exposure a pattern from a second patterning device onto the substrate, wherein the first patterning device comprises a first alignment pattern projected during the first exposure as part of an alignment mark on the substrate, and wherein the second patterning device comprises a second alignment pattern projected during the further exposure as part of the same alignment mark, wherein the first alignment pattern at least partially defines a first sub-mark of the alignment mark, and wherein the second alignment pattern at least partially defines a second sub-mark of the alignment mark, and wherein the first alignment pattern and the second alignment pattern in combination define at least one sub-mark, determining alignment of the first and further exposures on a macro level by comparison of relative positions of the first and second sub-marks on the substrate, and determining alignment of the first and further exposures on a micro level by comparison of relative positions of image lines of the first alignment pattern and the second alignment pattern within the at least one sub-mark on the substrate.

Various features and advantages of the invention, as well as the structure and operation of various embodiments of the present invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated in and constitute part of the specification, illustrate embodiments of the invention and, together with the general description given above and the detailed descriptions of embodiments given below, serve to explain the principles of the present invention. Embodiments of the invention will be described, by way of example only, with reference to the accompanying schematic drawings in which corresponding reference symbols indicate corresponding parts.

Features and advantages of the invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

The invention will be better understood from the following descriptions of various "embodiments" of the invention. Thus, specific "embodiments" are views of the invention, but each does not itself represent the whole invention. In some cases individual elements from one particular embodiment may be substituted for different elements in another embodiment carrying out a similar or corresponding function. It is expected that those skilled in the art with access to the teachings provided herein will recognize additional modifications, applications, and embodiments within the scope thereof and additional fields in which the invention would be of significant utility.

Figure 1:
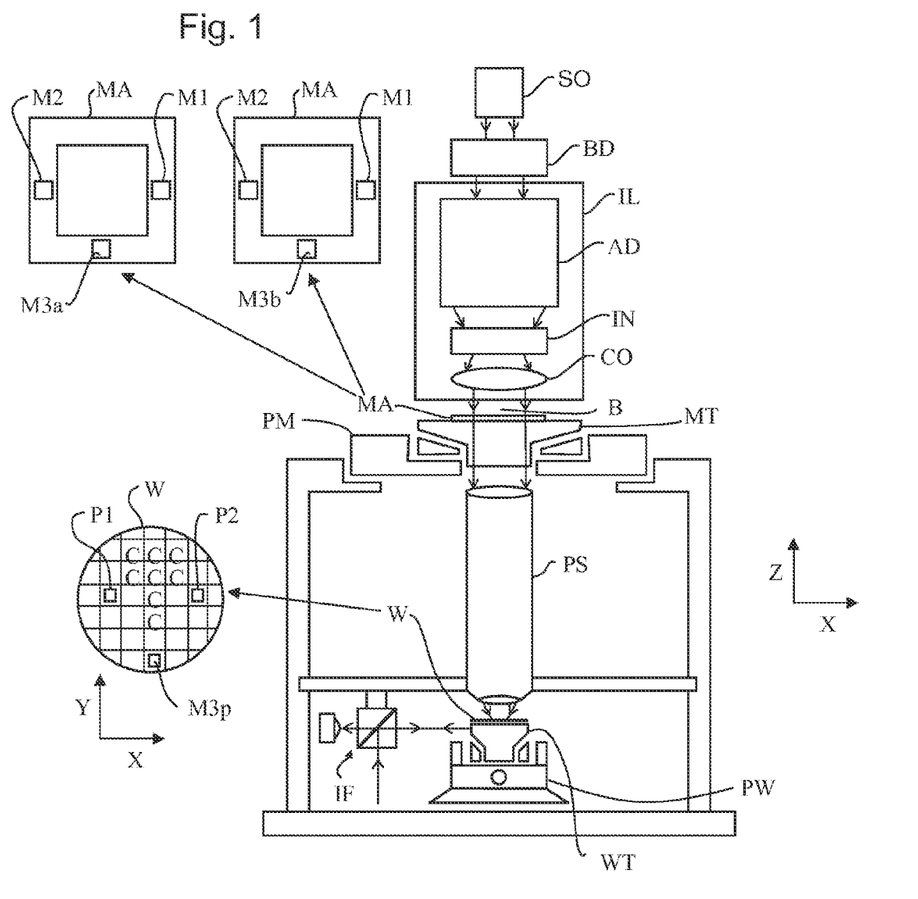
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

In FIG. 1, a set of two masks MA is shown. These two masks may for instance be used for a double patterning technique, wherein during a first exposure, the pattern of the first mask is projected on the substrate W, and, during a second exposure, the pattern of the second mask is projected on the substrate W. Each of the masks MA comprises in addition to the alignment marks M1, M2, an alignment pattern M3a, M3b. The alignment patterns M3a and M3b may be different. The alignment patterns M3a, M3b are projected on the substrate to form the alignment mark M3p. The comparison of the relative positions of the alignment patterns M3a, M3b as projected in the alignment mark M3p provides information of the relative positions of the patterns projected during the second exposure with respect to the patterns projected during the second exposure.

The alignment mark M3p formed by alignment patterns M3a, M3b provides information of alignment on macro level, but also of alignment on micro level. The terms "macro level" and "micro level" are used to indicate the relative relation between the two levels on which the alignment is determined, but does not necessarily relate to absolute ranges. The terms 'macro level' and 'micro level' are used to indicate the size of the measurement range comprising the features of the alignment mark that are used to determine alignment of the multiple exposures. However, both macro level and micro level design may be used to determine alignment of exposures with the same accuracy, for instance product resolution.

The macro level may for instance be in a range larger than 200 nm, preferably between 0.5 μm and 5 μm. The micro level is preferably about the same as the production resolution. This production resolution may be in a range smaller than 150 nm, preferably between 5 nm and 100 nm.

Furthermore, the alignment patterns M3a, M3b are chosen such that the macro level alignment and micro level alignment may be determined by using any possible technique, such as an optical or diffraction based technique.

The macro level alignment may for example be determined by scatterometry techniques (e.g. such as spectroscopic scatterometry or angle-resolved scatterometry), or by a method using a lithographic apparatus, while the micro level alignment may be determined by a method using measurements performed on a CD-SEM (Critical Dimension-Scanning Electron Microscopy).

Figure 2:
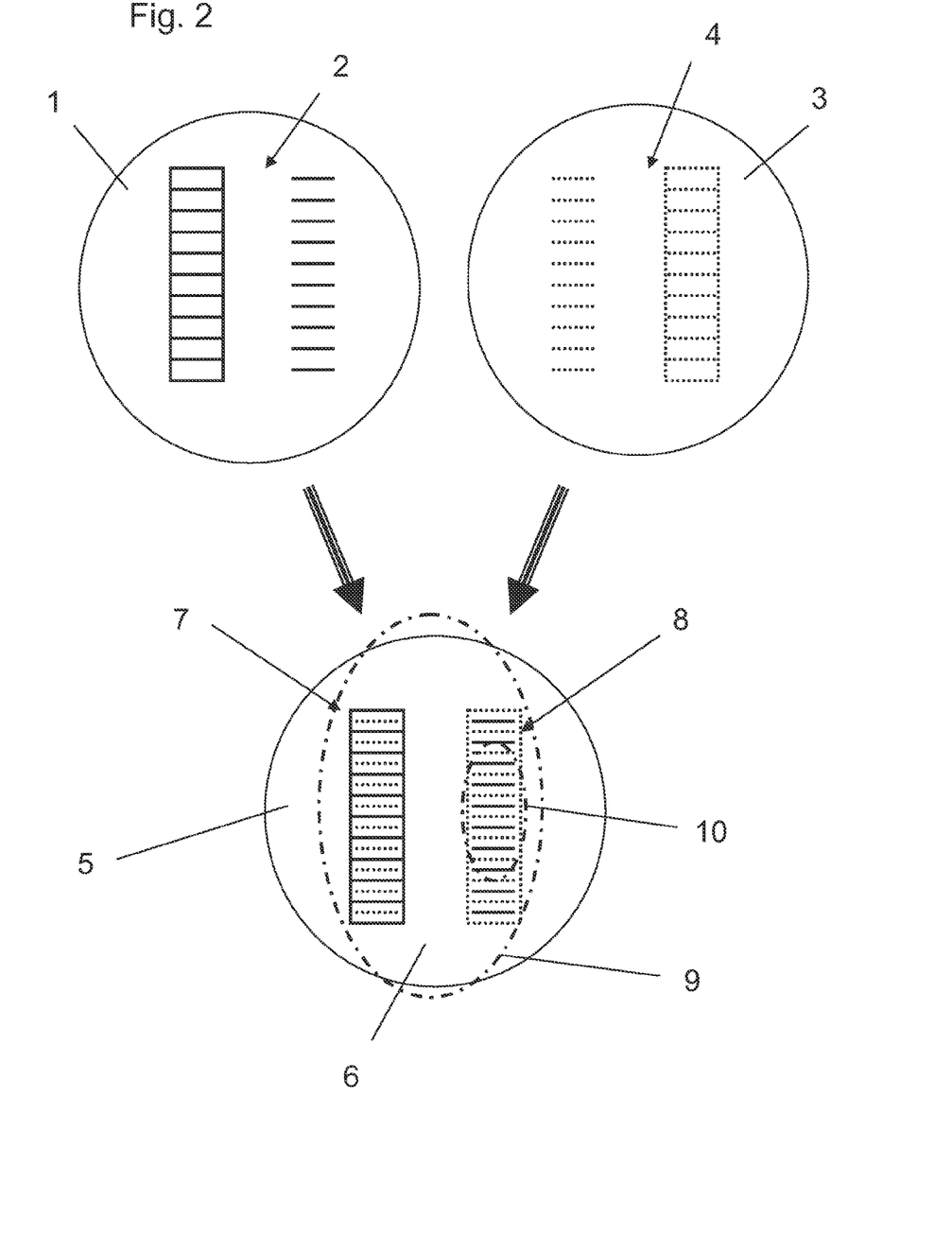
FIG. 2 depicts schematically the projection of two alignment patterns of a target mark on a set of patterning devices onto a substrate to form on the substrate an alignment mark according to the invention.
Figure 4:
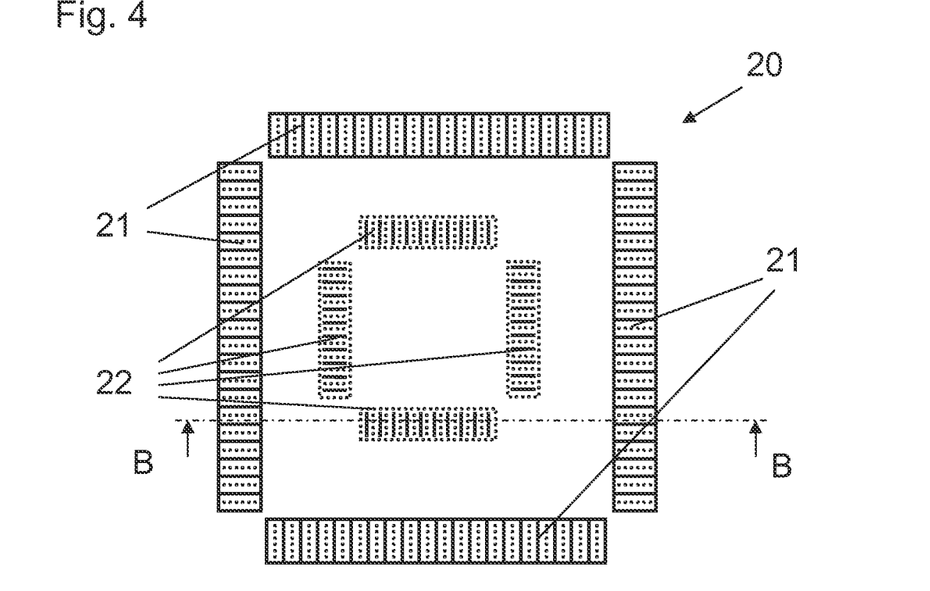
FIG. 4 depicts an alignment mark design according to the invention based on the alignment mark of FIG. 3.
Figure 7:
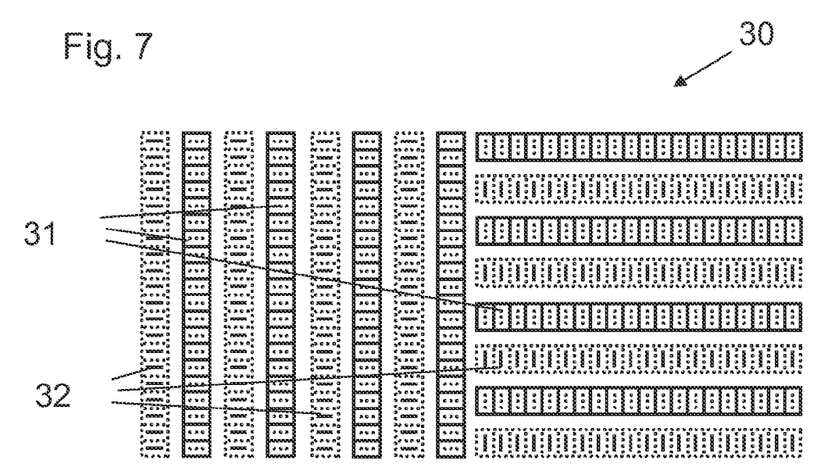
FIG. 7 depicts an alignment mark design according to the invention based on the alignment mark of FIG. 6.

The alignment patterns M3a, M3b, and the resulting alignment mark may be realized as shown in FIG. 2, 4 or 7, but also other suitable alignment patterns may be applied.

In an embodiment of the invention a known macro level target mark design is used. Such known target mark design may comprise at least a first sub-mark projected during the first exposure and a second sub-mark projected during the second exposure, wherein the relative positions of the projected first sub-mark and second sub-mark provide alignment information on macro level.

In a target mark according to the invention at least one of the sub-marks of the know target mark is sub-segmented into image lines, wherein a part of the image lines is projected during the first exposure and a part of the image lines during the second exposure. As a result, the respective sub-mark may be used to obtain alignment information on micro level. Thus one sub-mark may be used for both macro level and micro level alignment information.

In general for an embodiment of an alignment target according to the invention a part of the image lines is projected during a first exposure and a part of the image lines is projected during a further exposure. As will be understood by a person skilled in the art for double patterning processes the further exposure as mentioned before is usually the second exposure.

The term "image lines" is used to describe parts of the alignment pattern. These image lines do not have to be elongate lines, but may also have any other shape suitable to be used in an alignment pattern. An embodiment of an alignment mark according to the invention comprises at least one sub-mark which is at least partially defined by image lines of the first alignment pattern and the second alignment pattern. In other words, an alignment mark according to the invention comprises at least one sub-mark, which is at least partially defined by either the first alignment pattern or by the second alignment pattern, while the sub-mark is sub-segmented by image lines from either the second alignment pattern or the first alignment pattern, respectively.

In an embodiment, as described above, the sub-segmented sub-mark is one or more of the sub-marks used for macro level alignment information, and preferably all sub-marks are sub-segmented. However, the target mark according to the invention may also comprise two or more sub-marks for macro level alignment information and one or more other sub-segmented sub-marks for micro level alignment information.

In an embodiment, the outer circumference of a sub-segmented sub-mark is formed mainly, preferably completely, by image lines of one of the alignment patterns, since this outer circumference is used to determine macro alignment information. In such embodiment, image lines of one of the first and second alignment pattern define an array of rectangular cells, and lines of the other of the first and second alignment pattern define a line within each of the rectangular cells.

The lithographic apparatus as depicted in FIG. 1 could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIG. 2 shows a possible embodiment of an alignment target according to the invention. The top left portion of FIG. 2 shows a circular part of a patterning device 1 comprising a first alignment pattern 2. The top right portion of FIG. 2 shows a circular part of a patterning device 3 comprising a second alignment pattern 4. The set of patterning devices 1, 3 further includes projection patterns to be projected on a number of substrates 5. The patterning devices 1, 3 may be suitable for a double patterning process. A double patterning process may be used for increasing the feature density on the substrate.

To check the alignment of the first exposure of the first patterning device 1 and the second exposure of the second patterning device 3 with respect to each other, the alignment patterns 2, 4 are provided. It is remarked that the alignment pattern 4 is shown in dashed lines to see the difference between the alignment pattern 2 of the patterning device 1, and the alignment pattern 4 of the patterning device 3. The actual alignment pattern 4 may comprise solid lines.

During the first and second exposures the alignment patterns 2, 4 are projected on a part of the substrate 5, as shown at the bottom side of FIG. 2, to form an alignment mark 6, which is representative for the alignment of the first and second exposure on both macro level and micro level.

The alignment patterns 2, 4 form two sub-marks 7, 8. The outer circumference of the sub-mark 7 is formed by the first alignment pattern 2, while the outer circumference of the second sub-mark 8 is formed by the second alignment pattern 4. Within the image lines of the alignment pattern 2 of the sub-mark 7, image lines of the second alignment pattern 4 are provided, while within the image lines of the alignment pattern 4 of the sub-mark 8 image lines of the first alignment pattern 2 are provided. Thus the image lines of the first alignment pattern 2 enclose the image lines of the second alignment pattern 4 in sub-mark 7 and vice versa the image lines of the second alignment pattern 4 enclose the image lines of the first alignment pattern 2 in sub-mark 8.

Within the measurement area range 9, i.e. the macro level measurement range, the alignment of the first exposure and the second exposure may be determined on macro level by comparison of the relative positions of the two sub-marks 7, 8. Since typically the outer circumferences of the sub-marks 7, 8 will be compared, the comparison of the relative positions of the sub-marks 7, 8 corresponds to comparison of the positions of the first alignment pattern 2 and the second alignment pattern 4.

Within the measurement area 10, i.e. the micro level measurement range, the alignment of the first and second exposure may be determined on a micro level by comparison of the alignment patterns 2, 4 within the sub-mark 8. Correspondingly, the alignment between the first and the second exposures may also be determined by comparison between the alignment patterns 2, 4 within the sub-mark 7. The relative positions of the alignment pattern 2, 4 within the sub-marks 7, 8 may for instance be determined by a method using measurements performed on a CD-SEM.

Figure 3:
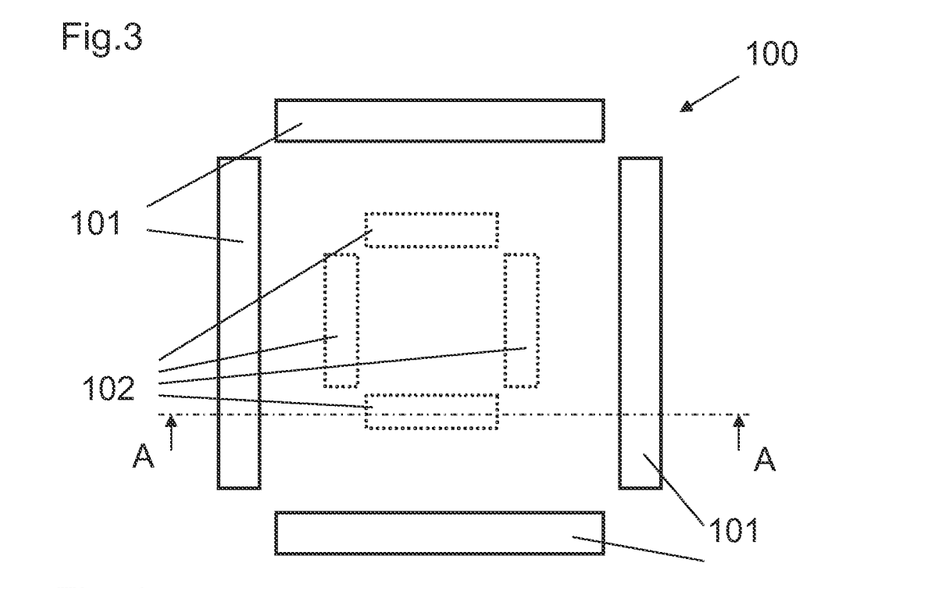
FIG. 3 depicts an example of a macro level prior art alignment mark.

FIG. 3 shows a prior art conventional bar-in-bar alignment mark 100 which is used to determine alignment on macro level by comparison of the relative position of the sub-marks. Such bar-in-bar design may be used in a measurement method to determine alignment of two subsequent exposures.

The alignment mark 100 is formed from four outer bar-shaped sub-marks 101 projected in a first exposure, and four inner bar-shaped sub-marks 102 projected in a second exposure. The relative positions of the sub-marks 101 and sub-marks 102 may be measured to determine the alignment of the first and the second exposure. The thickness of the bars of the substrate is about 2 μm, and thus the macro level range in which alignment can be determined is in substantially the same range for instance 2-10 μm.

Instead of the shown bar-in-bar design, the alignment mark may also comprise a number of differently positioned sub-marks projected in different exposures such that the relative positions are representative for the alignment of the first and the second exposure.

In an embodiment of the invention such conventional design may be used for the design of an alignment mark of the invention.

FIG. 4 shows an alignment mark design 20 based on the conventional design of FIG. 3.

In the embodiment of FIG. 4, each of the sub-marks 21, 22 is sub-segmented in a part which is projected during the first exposure (shown in solid lines), and a part which is projected during the second exposure (shown in dashed lines). Each sub-segmentation is chosen such that the outer circumference of each sub-mark is formed by one of the exposures. By creating the outer circumference of the sub-marks at the relevant side, preferably mainly and more preferably completely from one exposure, the conventional measurement method in which the relative positions of the sub-marks 21, 22 are compared, can reliably be maintained.

The size of the image lines within the sub-marks 21, 22 are chosen such that the product resolution of the actual product is resembled, for instance in the range 10 nm to 150 nm. As a result, alignment of the first and second exposure on product resolution level, i.e. micro level, can be determined within each of the sub-marks 21, 22. Therefore, in an alternative embodiment, only a part or even one of the sub-marks 21, 22 of the conventional design may be sub-segmented to obtain an alignment mark according to the invention.

The alignment mark of FIG. 4 makes alignment measurements on macro level and micro level with the same alignment mark and at the same location possible.

In an alternative embodiment, any other conventional alignment mark comprising a number of sub-marks may be used for the design of an alignment mark according to the invention. By sub-segmentation of at least one of the sub-marks in a part projected in the first exposure and a part projected in the second exposure, the conventional alignment mark may be made suitable for the conventional overlay measurement on macro level by comparison of the relative positions of the sub-marks and a further overlay measurement on micro level by comparison of the relative positions of the alignment patterns of the first exposure and the second exposure within a sub-mark.

Figure 5A:
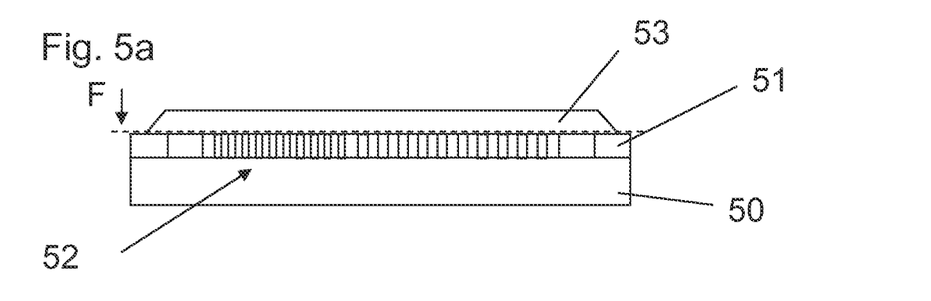
FIGS. 5a, 5b, and 5c depict cross sections of substrates before a second exposure in a double patterning process.
Figure 5B:
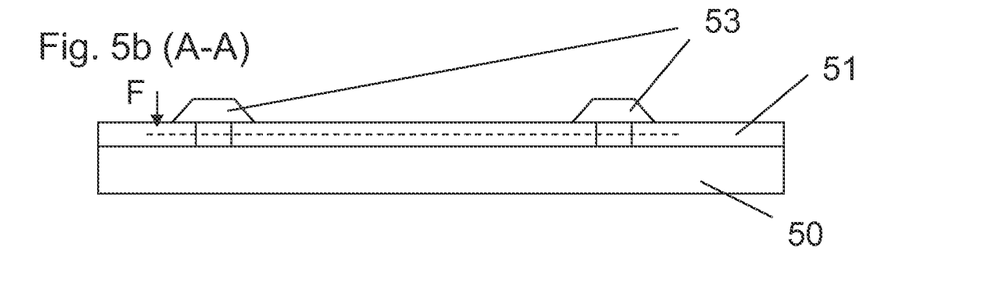
Figure 5C:
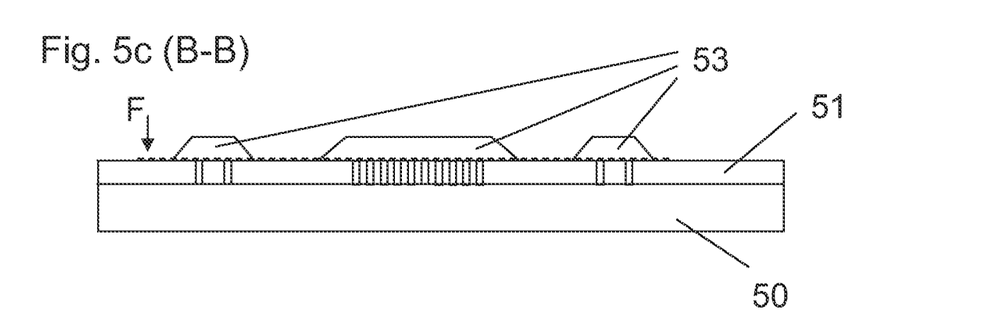

With reference to FIGS. 5a, 5b and 5c another advantage of the sub-segmentation of the sub-marks 21, 22 will be discussed. In some double patterning processes a photo-resistive layer is provided on the substrate between the two exposures. This layer is typically brought on the substrate by spinning the photo resistive layer material over the substrate surface after the first exposure. The photo-resistive material is attracted by the parts of the substrate on which the patterned beam is projected, i.e. the pattern projected on the substrate. When the distance between adjacent projected lines is relative small, such as usually is the case in the product pattern, the photo-resistive layer will be planar. When the distance is larger as in the case in conventional alignment targets the photo-resistive layer may show height differences.

FIG. 5a shows a part of the substrate 50 with a first photo-resistive layer 51 on which a pattern 52 is projected during a first exposure. A second photo-resistive layer 53 is provided on the substrate before the second exposure. The pattern of the second exposure is not shown. Since the resolution of the product pattern is relatively high, the second photo-resistive layer is equally attracted over the surface of the substrate and as a result planar. The optimal focus height F for the combination of the first and second photo-resistive layer for the second exposure is indicated in FIG. 5a by a dashed line.

In FIG. 5b, a cross section after the first exposure of the conventional target of FIG. 3 is shown along line A-A, i.e. sub-marks 101 are projected, but the sub-mark 102 is not yet projected on the substrate 50. After exposure in the first photo-resistive layer 51, a second photo-resistive layer 53 is provided on the substrate 50. Since the location where the sub-mark 102 is to be projected on the substrate 50, the second photo-resistive layer 53 is substantially lower at this location, or even not present. As a result, the optimal focus height F for the second exposure of the sub-mark 102 is substantially lower than the optimal focus height for product features. Since the best-focus exposure conditions are determined on product features, the second exposure of the alignment target will be printed out-of-focus, resulting in less reliable alignment measurements.

In FIG. 5c, a similar cross section after the first exposure on the substrate 50 of the alignment mark of FIG. 4 along line B-B is shown. After the first exposure in the first photo resistive layer 51, a part of all the sub-marks 21, 22 will be projected. As a result, the second photo-resistive layer 53 will be provided on all locations of the sub-marks 21, 22. Thus, in the areas where further parts of the sub-marks 21, 22 will be projected during the second exposure, a planar second photo-resistive layer 53 will be provided which will have substantially the same height as the second photo-resistive layer 53 on the product pattern of the substrate. Therefore, the optimal focus height F for the second exposure of the alignment mark substantially corresponds with the optimal focus height F of the product pattern, and the second exposure of the alignment mark can accurately be printed on the substrate.

Thus, sub-segmentation of each of the sub-marks in a part projected during the first exposure and a part projected in the second exposure, obviates focus problems due to different heights of the second photo-resistive layers in product and alignment mark areas of the substrates in certain double patterning processes. It is remarked that the focus problems may also be taken away by sub-segmentation of the sub-marks which conventionally are only projected in the first exposure.

Figure 6:
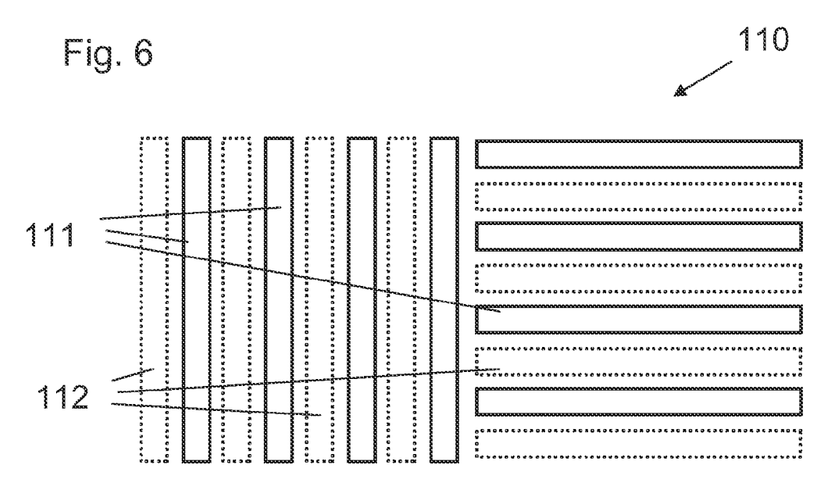
FIG. 6 depicts an alternative example of a macro level prior art alignment mark.

FIG. 6 shows another prior art conventional macro level alignment mark 110. This known design, may be used in a measurement method to determine alignment of two subsequent exposures.

The alignment mark 110 design comprises bar-shaped sub-marks 111 projected in a first exposure, and bar-shaped sub-marks 112 projected in a second exposure. The relative positions of the sub-marks 101 and sub-marks 102 may be measured to determine the alignment of the first and the second exposure on macro level.

Instead of the shown bar-in-bar design, the alignment mark may also comprise a number of differently positioned sub-marks projected in different exposures such that the relative positions are representative for the alignment of the different exposures with respect to each other.

FIG. 7 shows an alignment mark design 30 based on the conventional design of FIG. 6.

In the embodiment of FIG. 7, each of the sub-marks is sub-segmented in a part which is projected during the first exposure (shown in solid lines), and a part which is projected during the second exposure (shown in dashed lines). Each sub-segmentation is chosen such that the outer circumference of each sub-mark is formed by one of the exposures. By creating the outer circumference of the sub-marks at the relevant side, preferably mainly and more preferably completely from one exposure, the conventional measurement method on macro level in which the relative positions of the sub-marks 31, 32 are compared, can reliably be maintained.

The size of the image lines within the sub-marks 31, 32 are chosen such that the product resolution of the actual product is resembled, for instance in the range 5 nm to 150 nm. As a result, alignment of the first and second exposure micro level can be determined within each of the sub-marks 31, 32. Therefore, in an alternative embodiment, only a part or even one of the sub-marks 31, 32 of the conventional design may be sub-segmented to obtain an alignment mark according to the invention.

The alignment mark of FIG. 7 makes alignment measurements on macro level and micro level with the same alignment mark and at the same location possible.

The invention is also described by the following embodiments.

1. An alignment mark to determine alignment of a first and a further exposure on a substrate on a macro level and a micro level, the alignment mark comprising a first alignment pattern projected during the first exposure and a second alignment pattern projected during the further exposure, wherein the alignment mark comprises a first sub-mark at least partially defined by the first alignment pattern and a second sub-mark at least partially defined by the second alignment pattern, wherein relative positions of the first and second sub-marks on the substrate are representative for alignment of the first and further exposures on the macro level, and wherein at least one sub-mark is at least partially defined by image lines of the first alignment pattern and the second alignment pattern, wherein a part of the image lines is projected during the first exposure and a part of the image lines is projected during the further exposure, and wherein relative positions of image lines of the first alignment pattern and image lines of the second alignment pattern of the at least one sub-mark are representative for alignment of the first and further exposures on the micro level.

2. The alignment mark of embodiment 1, wherein the at least one sub-mark is the first sub-mark or the second sub-mark.

3. The alignment mark of embodiment 1, wherein each of the first sub-mark and the second sub-mark are defined by image lines of the first alignment pattern and the second alignment pattern.

4. The alignment mark of embodiment 1, wherein, in the at least one sub-mark, image lines of one of the first and second alignment pattern enclose lines of the other alignment pattern.

5. The alignment mark of embodiment 1, wherein, in the at least one sub-mark, image lines of one of the first and second alignment pattern define an array of rectangular cells, and lines of the other of the first and second alignment pattern define a line within each of the rectangular cells.

6. The alignment mark of embodiment 1, wherein the first exposure and the further exposure are part of a double patterning process.

7. The alignment mark of embodiment 1, wherein the micro level is substantially the same as the projection resolution on the substrate.

8. The alignment mark of embodiment 1, wherein the micro level is in a range smaller than 150 nm, preferably between 5 nm and 100 nm.

9. The alignment mark of embodiment 1, wherein the macro level is in a range larger than 200 nm, preferably between 0.5 μm and 50 μm.

10. The alignment mark of embodiment 1, wherein a width of the first and second sub-mark is larger than 200 nm, preferably between 0.5 μm and 5 μm.

11. The alignment mark of claim 1, wherein the width of the sub-marks is between 0.5 μm and 5 μm.

12. A substrate comprising the alignment mark of any of the embodiment 1-11.

13. Set of patterning devices for use in a lithographic process, comprising:

a first patterning device having a first alignment pattern to be projected on a substrate during a first exposure as part of an alignment mark, and a second patterning device having a second alignment pattern to be projected on the substrate during a further exposure as part of the same alignment mark, wherein the first alignment pattern at least partially defines a first sub-mark of the alignment mark, and wherein the second alignment pattern at least partially defines a second sub-mark of the alignment mark, wherein relative positions of the first and second sub-marks on the substrate are suitable to determine alignment of the first and further exposures on macro level, and wherein the first alignment pattern and the second alignment pattern in combination define at least one sub-mark, which is at least partially defined by image lines of the first alignment pattern and the second alignment pattern, wherein a part of the image lines is projected during the first exposure and a part of the image lines is projected during the further exposure, and wherein relative positions of image lines of the first alignment pattern and the second alignment pattern of the at least one sub-mark on the substrate are suitable to determine alignment of the first and further exposures on micro level.

14. The set of patterning devices of embodiment 13, wherein the alignment mark comprises any of the features of the embodiments 1-11.

15. A device manufacturing method comprising:

transferring during a first exposure a pattern from a first patterning device onto a substrate, transferring during a further exposure a pattern from a second patterning device onto the substrate, wherein the first patterning device comprises a first alignment pattern projected during the first exposure as part of an alignment mark on the substrate, and wherein the second patterning device comprises a second alignment pattern projected during the further exposure as part of the same alignment mark, wherein the first alignment pattern at least partially defines a first sub-mark of the alignment mark, and wherein the second alignment pattern at least partially defines a second sub-mark of the alignment mark, and wherein the first alignment pattern and the second alignment pattern in combination define at least one sub-mark, determining alignment of the first and further exposures on macro level by comparison of relative positions of the first and second sub-marks on the substrate, and determining alignment of the first and further exposures on micro level by comparison of relative positions of image lines of the first alignment pattern and the second alignment pattern within the at least one sub-mark on the substrate.

16. The method of embodiment 15, wherein the first and further exposure are part of a double patterning process.

17. The method of embodiment 15, wherein the alignment mark comprises any of the features of the embodiments 1-11.

19. The method of embodiment 15, wherein a photo-resistive layer is arranged on the substrate between the first and further exposure.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. It is to be appreciated that the Detailed Description section, and not the Summary and Abstract sections, is intended to be used to interpret the claims. The Summary and Abstract sections can set forth one or more but not all exemplary embodiments of the present invention as contemplated by the inventor(s), and thus, are not intended to limit the present invention and the appended claims in any way.

The invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Various embodiments of the invention have been described above. It should be understood that they have been presented by way of example only, and not limitation. It will be apparent to persons skilled in the relevant art that various changes in form and detail can be made from those specifically described without departing from the spirit and scope of the invention. Thus, the breadth and scope of the present invention should not be limited by any of the above-described exemplary embodiments, but should be defined only in accordance with the following claims and their equivalents.

What is claimed is:

1. A device manufacturing method comprising:
transferring, during a first exposure, a first alignment pattern from a first patterning device onto a substrate;
transferring, during a second exposure, a second alignment pattern from a second patterning device onto the substrate, wherein:
the first alignment pattern comprising a first array of image lines and a second array of image lines is projected as part of an alignment mark on the substrate,
the second alignment pattern comprising a third array of image lines and a fourth array of image lines is projected as part of the alignment mark,
the first alignment pattern at least partially defines a first sub-mark of the alignment mark, the first sub-mark being at least partially defined by the first and third arrays of image lines,
the second alignment pattern at least partially defines a second sub-mark of the alignment mark, the second sub-mark being at least partially defined by the second and fourth arrays of image lines,
the first, second, third, and fourth arrays of image lines are non-overlapping with respect to each other, and
the first and fourth arrays of image lines surround the third and second arrays of image lines, respectively;
determining alignment of the first and second exposures on a macro level by comparing relative positions of the first and second sub-marks on the substrate; and
determining alignment of the first and second exposures on a micro level by comparing relative positions of the image lines of the first alignment pattern and the image lines of the second alignment pattern within at least the first sub-mark or the second sub-mark on the substrate.

2. The method of claim 1, wherein the first and second exposures are part of a double patterning process.

3. The method of claim 1, wherein the outer perimeter of the first sub-mark is defined by the first alignment pattern.

4. The method of claim 1, wherein the outer perimeter of the second sub-mark is defined by the second alignment pattern.

5. The method of claim 1, wherein the first sub-mark is defined by the first and third arrays of image lines.

6. The method of claim 1, wherein the second sub-mark is defined by the second and fourth arrays of image lines.

7. The method of claim 1, wherein:
the first or fourth arrays of image lines define an array of rectangular cells; and
the third or second arrays of image lines define a line within each of the rectangular cells, respectively.

8. The method of claim 1, wherein the micro level is substantially equal to a projection resolution on the substrate.

9. The method of claim 1, wherein the micro level is in a range smaller than about 150 nm or between about 5 nm and about 100 nm.

10. The method of claim 1, wherein the macro level is in a range larger than about 200 nm or between about 0.5 μm and about 50 μm.

11. The method of claim 1, wherein a width of the first sub-mark and a width of the second sub-mark is larger than about 200 nm or between about 0.5 μm and about 5 μm.

* * * * *